US009812666B2

(12) United States Patent
Shin

(10) Patent No.: US 9,812,666 B2
(45) Date of Patent: Nov. 7, 2017

(54) ORGANIC LIGHT EMITTING DISPLAY DEVICE AND METHOD FOR MANUFACTURING THE SAME

(71) Applicant: LG Display Co., Ltd., Seoul (KR)

(72) Inventor: HongDae Shin, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 52 days.

(21) Appl. No.: 14/724,983

(22) Filed: May 29, 2015

(65) Prior Publication Data

US 2016/0043344 A1    Feb. 11, 2016

(30) Foreign Application Priority Data

Aug. 6, 2014   (KR) ......................... 10-2014-0100808

(51) Int. Cl.
| | | |
|---|---|---|
| H01L 51/52 | (2006.01) |
| H01L 27/32 | (2006.01) |
| H01L 25/16 | (2006.01) |
| H05K 1/14 | (2006.01) |

(52) U.S. Cl.
CPC ........ H01L 51/5246 (2013.01); H01L 25/167 (2013.01); H01L 27/3276 (2013.01); H01L 51/5243 (2013.01); *H01L 51/5237* (2013.01); *H01L 2251/558* (2013.01); *H01L 2924/0002* (2013.01); *H05K 1/147* (2013.01); *H05K 2201/10128* (2013.01); *H05K 2201/10681* (2013.01)

(58) Field of Classification Search
None
See application file for complete search history.

(56) References Cited

U.S. PATENT DOCUMENTS

| | | | | |
|---|---|---|---|---|
| 2008/0012477 A1* | 1/2008 | Koo | ................... | H01L 51/5253 313/504 |
| 2010/0264817 A1* | 10/2010 | Bouten | ............. | G02F 1/133305 313/512 |
| 2011/0127556 A1 | 6/2011 | Lee et al. | | |
| 2013/0088671 A1* | 4/2013 | Drzaic | ................ | G02F 1/13452 349/106 |
| 2013/0257696 A1 | 10/2013 | Ha et al. | | |

(Continued)

FOREIGN PATENT DOCUMENTS

JP          2003280539 A      10/2003

OTHER PUBLICATIONS

Communication dated Dec. 22, 2015, from The European Patent Office in counterpart European application No. 15172348.3-1552.

*Primary Examiner* — William Coleman
*Assistant Examiner* — Kien Ly
(74) *Attorney, Agent, or Firm* — Morgan, Lewis & Bockius LLP

(57) ABSTRACT

An organic light-emitting display device includes an organic light-emitting element on a substrate, a metal substrate, and an encapsulation unit configured to seal the organic light-emitting element, and a structure in which a driving film is connected so as not to be protruded further than the substrate. A portion of the encapsulation unit is between the metal substrate and the driving film, and the portion of the encapsulation unit is configured to reduce damage to the driving film caused by the metal substrate. Thus, the organic light-emitting display device may realize a narrow bezel and also reduce a driving defect caused by damage to the driving film.

21 Claims, 10 Drawing Sheets

(56) References Cited

U.S. PATENT DOCUMENTS

| | | | |
|---|---|---|---|
| 2014/0049522 A1* | 2/2014 | Mathew | H05B 33/0896 345/204 |
| 2014/0103315 A1* | 4/2014 | Jung | H01L 27/3276 257/40 |
| 2014/0183491 A1 | 7/2014 | Shin et al. | |
| 2014/0374719 A1 | 12/2014 | Cho et al. | |

* cited by examiner

ORGANIC LIGHT EMITTING DISPLAY DEVICE AND METHOD FOR MANUFACTURING THE SAME

CROSS-REFERENCE TO RELATED APPLICATIONS

This application claims the benefit of priority of Korean Patent Application No. 10-2014-0100808, filed on Aug. 6, 2014, in the Korean Intellectual Property Office, the entire disclosure of which is incorporated herein by reference for all purposes.

BACKGROUND OF THE INVENTION

Field of the Invention

The present disclosure relates to an organic light-emitting display device, and a method for manufacturing the same, in which an encapsulation unit may be formed to cover a side surface of a substrate, thereby reducing damage caused by the substrate to a driving film, and thus improving reliability of the organic light-emitting display device.

Description of the Related Art

An organic light-emitting display device (OLED) is a self-light-emitting display device in which an organic light-emitting layer may be disposed between two electrodes, an electron and a hole are respectively injected from the two electrodes into the organic light-emitting layer, and light is emitted by combining the injected electron and hole. The organic light-emitting display device is advantageous in terms of power consumption because it is driven with low voltage. Also, the organic light-emitting display device has a high response speed and a wide viewing angle. Therefore, the organic light-emitting display device has been recognized as a next-generation display device.

An organic light-emitting display device may be classified into a top emission type, a bottom emission type, and a dual emission type, depending on a direction of light emission, and can also be classified into an active matrix type or a passive matrix type, depending on a driving method.

SUMMARY OF THE INVENTION

An organic light-emitting display device includes a circuit unit configured to supply various signals to an organic light-emitting element. This will be described with reference to FIG. 1A and FIG. 1B.

FIG. 1A and FIG. 1B are cross-sectional views illustrating an example of a bottom-emission organic light-emitting display device. With reference to FIG. 1A, an organic light-emitting element 20 and an encapsulation unit 40 configured to cover the organic light-emitting element 20 are disposed on a first substrate 10, and a second substrate 50 formed of a metallic material is disposed on the encapsulation unit 40. Further, a pad unit 30, and a driving film 60a connected with the pad unit 30 and having a driving chip (D-IC) 61a mounted thereon are disposed at an outer periphery of the first substrate 10. The pad unit 30 and the driving film 60a may be referred to as a circuit unit. Although not illustrated in the drawing, a line connecting the pad unit 30 with the organic light-emitting element 20 is formed on the first substrate 10, and the organic light-emitting element 20 can receive various signals from the circuit unit through the line. Further, as illustrated in FIG. 1A, a cover unit 70 is disposed at an outer periphery of the organic light-emitting display device in order to protect internal components.

If the organic light-emitting display device is of a bottom emission type, the driving film 60a connected with the first substrate 10 may be disposed as being bent toward the second substrate 50. For example, the driving chip 61a and a driving line (not illustrated) are formed on one surface 1S of the driving film 60a, and the driving line is connected with the pad unit 30 of the first substrate 10 so as to transmit a signal of the driving chip 61a to the pad unit 30. In this case, the driving film 60a may use a single-side flexible printed circuit board.

As illustrated in FIG. 1A, the driving film 60a is disposed as being bent toward the second substrate 50, and a part of the driving film 60a protrudes further than the first substrate 10. Herein, a sufficient space for the protruded part of the driving film 60a may be needed in order to sufficiently attach the pad unit 30 to the driving film 60a. For example, a sufficient distance D1 between the first substrate 10 and the cover unit 70 may need to be secured. Therefore, it may be difficult to realize a narrow bezel.

In order to realize a narrow bezel of the organic light-emitting display device, embodiments of the present invention recognize a reverse-bonding manner in which a driving film 60b is disposed directly toward the second substrate 50, as illustrated by an example in FIG. 1B. FIG. 1B shows a driving chip 61b that may be mounted on one surface 1S of the driving film 60b, and the other surface 2S of the driving film 60b opposite to the surface 1S of the driving film 60b may be attached to the pad unit 30. Thus, the driving film 60b may be disposed directly toward the second substrate 50 without having a part protruding further than the first substrate 10. In this case, the driving film 60b may use a double-sided flexible printed circuit board.

If the driving film 60b is disposed directly toward the second substrate 50 as described above, it may not be necessary to secure the distance D1 between the first substrate 10 and the cover unit 70 as shown in the structure of FIG. 1A. This may be advantageous in realizing a narrow bezel of the organic light-emitting display device. However, if the driving film 60b is attached to the pad unit 30 as shown in FIG. 1B, when a pressure is applied to the surface 1S of the driving surface 60b, the driving film 60b may be damaged by a sharp edge of the second substrate 50 formed of a metallic material. That is, a portion of the driving film 60b that is in contact with an edge of the second substrate 50 may be damaged, e.g., dented, by a pressure applied to the driving film 60b. Due to such damage, a crack may occur at a driving line formed in the driving film 60a, and, in a severe case, a disconnection may occur. The second substrate 50 formed of a metallic material and the driving line formed in the driving film 60b can be electrically shorted, which may also result in a burnt defect. The short and burnt defects may cause a driving defect and may result in a decrease in the reliability of the organic light-emitting display device.

Otherwise, although not illustrated in the drawing, if the driving film 60b is a single-side flexible printed circuit board, the driving chip 61b may be mounted on a part of the surface 2S of the driving film 60b, so that the driving chip 61b is disposed to face the second substrate 50. In this structure, a portion of the driving film 60b that is in contact with an edge of the second substrate 50 may be damaged, e.g., dented, by a pressure applied to the driving film 60b, and, thus, various driving defects may occur.

When the driving film 60b is attached to the pad unit 30, it may be possible to reduce damage to the driving film 60b caused by an attachment pressure by sufficiently increasing a distance D2 between the second substrate 50 and the pad unit 30. However, this may reduce the ability to realize a narrow bezel.

Embodiments of the present invention therefore may include an organic light-emitting display device of a new structure capable of realizing a narrow bezel and also improving reliability of the organic light-emitting display device. Embodiments also include a method for manufacturing the same.

An object according to an example embodiment of the present invention is to provide an organic light-emitting display device and a method for manufacturing the same in which an encapsulation unit is formed to cover a side surface of a second substrate, thereby realizing a narrow bezel of the organic light-emitting display device and also reducing damage to a driving film caused by the second substrate and thus improving reliability of the organic light-emitting display device.

The objects of the present invention are not limited to the aforementioned objects, and other objects, which are not mentioned above, will be apparent to a person having ordinary skill in the art from the following description.

According to an aspect of the present invention, an organic light-emitting display device comprises an organic light-emitting element on a substrate, a metal substrate, and an encapsulation unit configured to seal the organic light-emitting element. The display device further comprises a structure in which a driving film is connected so as not to be protruded further than the substrate. A portion of the encapsulation unit is between the metal substrate and the driving film, and the portion of the encapsulation unit is configured to reduce damage to the driving film caused by the metal substrate.

According to another aspect of the present invention, an organic light-emitting display device comprises an organic light-emitting element on a first substrate, an encapsulation unit covering the organic light-emitting element, and a second substrate on the encapsulation unit. The encapsulation unit covers the second substrate at least from a first edge where a bottom surface and a side surface of the second substrate meet to a second edge where a top surface and the side surface of the second substrate meet.

According to another aspect of the present invention, a method for manufacturing an organic light-emitting display device comprises forming an organic light-emitting element and a pad unit on a first substrate; laminating an encapsulation unit on a first surface of a second substrate, the second substrate including the first surface, a second surface, and a third surface facing the first surface, the second surface being a side surface spanning between the first surface and the third surface; bonding the first substrate and the second substrate together such that the encapsulation unit covers the organic light-emitting element, and the encapsulation unit is extended to cover from an edge where the first surface and the second surface of the second substrate meet, to an edge where the second surface and the third surface of the second substrate meet; and attaching a driving film to the pad unit, wherein a driving chip is mounted on the driving film.

According to another aspect of the present invention, an organic light-emitting display device comprises a first substrate, an organic light-emitting element, and a second substrate. The organic light-emitting element is between the first substrate and the second substrate, and the second substrate includes a bottom surface having a first edge, a top surface having a second edge, and a side surface defined between the first edge and the second edge. An encapsulation unit covers the organic light-emitting element and is on the bottom surface, the side surface, and a portion of the top surface of the second substrate. A driving film is on the first substrate and on the encapsulation unit where the encapsulation unit covers the portion of the top surface of the second substrate, and the encapsulation unit is between the driving film and the second substrate.

Thus, it may be possible to realize a narrow bezel and also reduce a driving defect caused by damage to the driving film, thereby improving reliability of an organic light-emitting display device.

Further, it is possible to improve various contact defects caused by deformation of a second substrate during a process of an organic light-emitting display device.

The effects of the present invention are not limited to the aforementioned effects, and other effects, which are not mentioned above, will be apparent to a person having ordinary skill in the art from the following description.

The objects to be achieved by the invention, the means for achieving the objects, and effects of the invention described above do not specify essential features of the claims, and, thus, the scope of the claims is not limited to the disclosure of the invention.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EMBODIMENTS

Figure 1A:
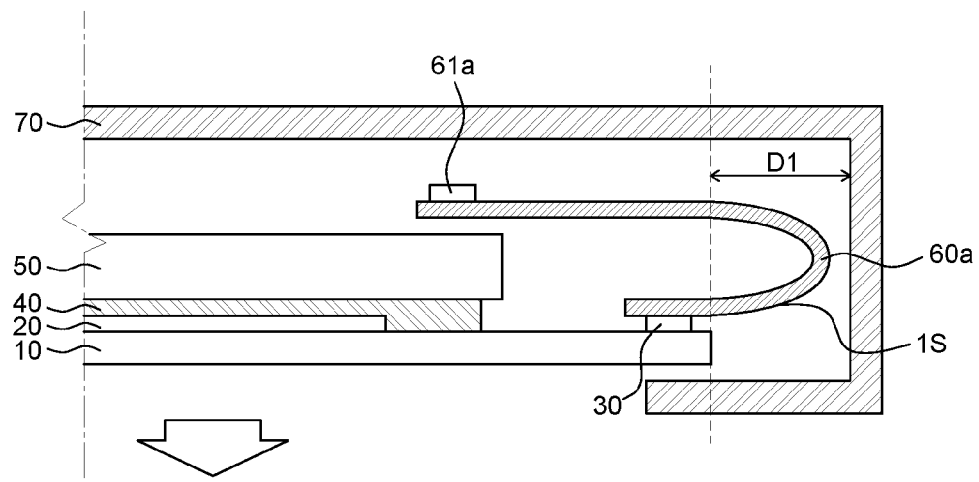
FIGS. 1A and 1B are cross-sectional views illustrating an organic light-emitting display device.
Figure 1B:
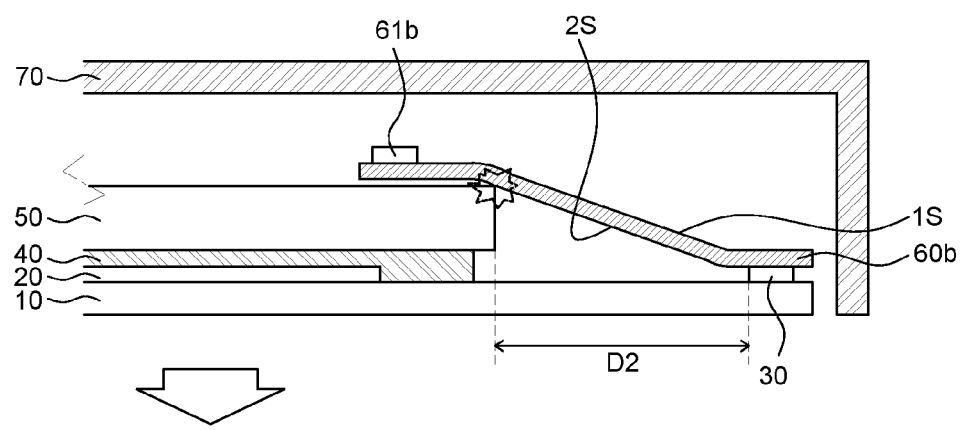

Advantages and features of the present invention, and methods for accomplishing the same will be more clearly understood from example embodiments described below with reference to the accompanying drawings. However, the present invention is not limited to the following example embodiments but may be implemented in various different forms. The example embodiments are provided only to complete disclosure of the present invention and to fully provide a person having ordinary skill in the art to which the present invention pertains with the category of the invention, and the present invention will be defined by the appended claims.

The shapes, sizes, ratios, angles, numbers, and the like shown in the accompanying drawings for describing the example embodiments of the present invention are merely examples, and the present invention is not limited thereto. Like reference numerals generally denote like elements throughout the present specification. Further, in the following description, a detailed explanation of known related technologies may be omitted to avoid unnecessarily obscuring the subject matter of the present disclosure.

The terms such as "including," "having," and "consist of" used herein are generally intended to allow other components to be added unless the terms are used with the term "only". Any references to singular may include plural, unless expressly stated otherwise.

Components are interpreted to include an ordinary error range even if not expressly stated.

When the position relation between two parts is described using the terms such as "on", "above", "below", "next" and the like, one or more parts may be positioned between the two parts unless the terms are used with the term "immediately" or "directly".

When the relation in order of time is described using the terms such as "after", "subsequent to", "next to", "before" and the like, discontinuous relations may be included unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present invention.

The features of various embodiments of the present invention can be partially or entirely bonded to or combined with each other and can be interlocked and operated in technically various ways as can be fully understood by a person having ordinary skill in the art, and the embodiments can be carried out independently of or in association with each other.

Hereinafter, an organic light-emitting display device according to an example embodiment of the present invention will be described in detail with reference to the accompanying drawings.

Figure 2:
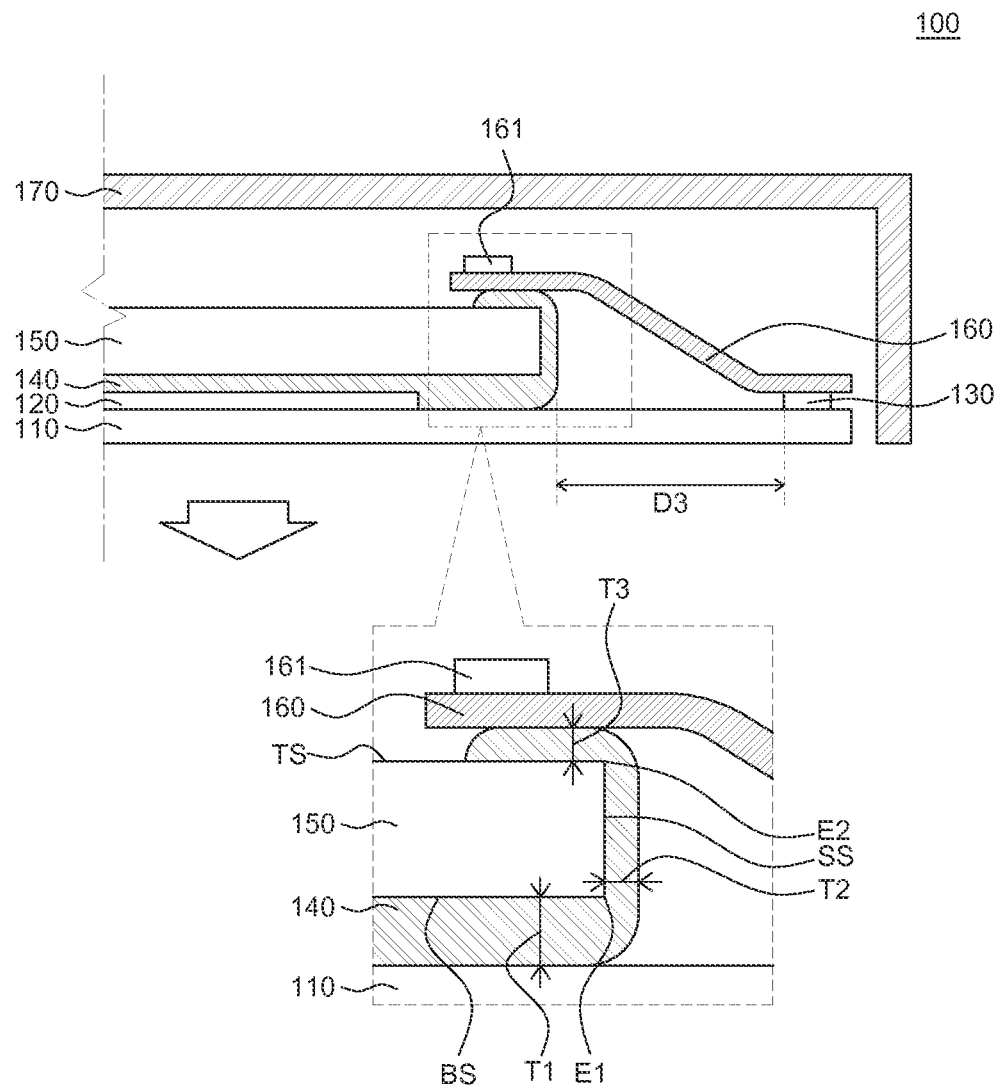
FIG. 2 is a cross-sectional view illustrating an organic light-emitting display device according to an example embodiment of the present invention.

FIG. 2 provides a cross-sectional view and an enlarged view illustrating an organic light-emitting display device 100 according to an example embodiment of the present invention. The organic light-emitting display device 100 may be a bottom-emission organic light-emitting display device and may include a first substrate 110, an organic light-emitting element 120, an encapsulation unit 140, a second substrate 150, a pad unit 130, a driving chip 161, a driving film 160, and a cover unit 170.

With reference to the example of FIG. 2, the organic light-emitting element 120 and the encapsulation unit 140 configured to cover the organic light-emitting element 120 are disposed on the first substrate 110. Further, the second substrate 150 formed of a metallic material is disposed on the encapsulation unit 140.

The first substrate 110 may be formed of glass or a transparent insulating material made of plastic, and a light emitted from the organic light-emitting element 120 may be emitted in a direction toward the first substrate 110.

The organic light-emitting element 120 may include two electrodes and an organic light-emitting layer interposed between the two electrodes. The organic light-emitting layer may be formed into a single light-emitting layer structure that emits a single light, or may be formed into multiple light-emitting layer structures that emit a white light, but may not be limited thereto. The organic light-emitting layer may be formed to have various laminate structures depending on a design of the organic light-emitting element 120.

The second substrate 150 may be formed of a metallic material which may be one selected from, for example, aluminum (Al), copper (Cu), and tungsten (W), or combinations thereof, and may have thickness in a range of about 10 μm to 200 μm.

The first substrate 110 may be formed to protrude further than the second substrate 150. The pad unit 130 may be formed on the protruded part of the first substrate 110. Further, the pad unit 130 is connected with the driving film 160 on which the driving chip 161 is mounted. The driving film 160 may be disposed directly toward the second substrate 150 without being protruded further than the first substrate 110, as illustrated in FIG. 2. Further, FIG. 2 illustrates that the driving chip 161 is mounted on one surface of the driving film 160, and the other surface of the driving film 160 opposite to the one surface of the driving film 160 is attached to the pad unit 130. However, the driving chip 161 may be mounted on a part of the other surface of the driving film 160 to which the pad unit 130 is bonded. In this case, the driving chip 161 bonded to the driving film 160 may be disposed to face the second substrate 150.

As illustrated in FIG. 2, the encapsulation unit 140 may be disposed to cover the organic light-emitting element 120. The encapsulation unit 140 may be configured to protect the organic light-emitting element 120 against infiltration of moisture (e.g., $H_2O$) or oxygen (e.g., $O_2$) from the outside and bond the first substrate 110 to the second substrate 150. Further, the encapsulation unit 150 may be formed of a resin and may be formed of a polymer material such as epoxy, olefin, silicone, acryl, vinyl, etc., but may not be limited thereto. Further, the encapsulation unit 140 may be formed of, e.g., a thermosetting resin or a photopolymer resin.

In the structure according to an example embodiment of the present invention, the encapsulation unit 140 may be formed to cover a side surface of the second substrate 150. Thus, a part of the encapsulation unit 140 is disposed between the second substrate 150 and the driving film 160. The organic light-emitting display device 100 according to an example embodiment of the present invention employs a metal encapsulation structure, in which the organic light-emitting element 120 is sealed by the second substrate 150 formed of a metallic material, and the encapsulation unit 140. The metal encapsulation structure adopts a reverse-bonding type driving film 160 and may have a structure in which the encapsulation unit 140 is extended along an edge of the second substrate 150 in order to reduce and/or minimize damage, caused by the second substrate 150, to the driving film 160. The driving film 160 is disposed so as not to be further protruded than the first substrate 110 by a reverse-bonding manner A portion of the encapsulation unit is configured to reduce and/or minimize damage to the driving film caused by the metal substrate. For example, the encapsulation unit 140 is extended to cover from a first edge E1 where a bottom surface BS and a side surface SS of the second substrate 150 meet to a second edge E2 where a top surface TS and the side surface SS of the second substrate 150 meet, as illustrated in the enlarged view of FIG. 2. In other words, the encapsulation unit covers at least two different edges of the metal substrate. Thus, the driving film 160 is disposed to be in contact with a portion of the encapsulation unit 140 formed on the top surface TS of the second substrate 150. Therefore, the driving film 160 is not brought into contact with the second edge E2 of the second substrate 150.

As described above, if the driving film 160 is attached to the pad unit 130, when pressure is applied to one surface of the driving film 160, a portion of the driving film 160 that is in contact with a sharp edge of the second substrate 150 formed of a metallic material may be damaged, e.g., dented. Thus, a crack or disconnection may occur at a driving line (not illustrated) formed in the driving film 160. Or, a burnt defect may be caused by a short between the second substrate 150 formed of a metallic material and the driving line formed in the driving film 160, which may aggravate the defect of the organic light-emitting display device.

In the structure of the organic light-emitting display device 100 according to an example embodiment of the present invention, the encapsulation unit 140 is extended to cover the side edges E1 and E2 of the second substrate 150, so that the driving film 160 and the second substrate 150 are not brought into direct contact with each other. Thus, it may be possible to reduce damage to the driving film 160 caused by the second substrate 150. Further, when the driving film 160 is attached to the pad unit 130, it may not be necessary to increase a distance between the second substrate 150 and the pad unit 130 in order to reduce damage to the driving film 160 caused by an attachment pressure. Therefore, it may be more effective in realizing a narrow bezel. In an example embodiment, when a narrow bezel is realized, a distance D3 from an outermost side surface of the encapsulation unit 140 disposed on the side surface SS of the second substrate 150 to the pad unit 130 may be about 750 µm or less.

Further, the encapsulation unit 140 may have different thicknesses at different positions. As illustrated in FIG. 2, the thickness T2 of the encapsulation unit 140 disposed on the side surface SS of the second substrate 150 or the thickness T3 of the encapsulation unit 140 disposed on the top surface TS of the second substrate 150 may be smaller than the thickness T1 of the encapsulation unit 140 disposed on the bottom surface BS of the second substrate 150. For example, the thickness T1 of the encapsulation unit 140 disposed on the bottom surface BS of the second substrate 150 may need to be sufficient to protect the organic light-emitting element 120 against infiltration of moisture (e.g., $H_2O$) or oxygen (e.g., $O_2$) from the outside, and may be in a range of about 10 µm to 100 µm. However, the thickness T2 or T3 of the encapsulation unit 140 disposed on the side surface SS or the top surface TS of the second substrate 150 is required to have a thickness by which the driving film 160 is not direct contact with the second substrate 150. Thus, the thickness T2 or T3 may be smaller than the thickness T1 of the encapsulation unit 140 disposed on the bottom surface BS of the second substrate 150.

Therefore, in the organic light-emitting display device 100 according to an example embodiment of the present invention, the encapsulation unit 140 may be extended to cover the side edges E1 and E2 of the second substrate 150, so that the driving film 160 and the second substrate 150 are not brought into direct contact with each other. Thus, it may be possible to realize a narrow bezel and also reduce various driving defects caused by damage to the driving film 160, thereby improving the reliability of the organic light-emitting display device.

Figure 3:
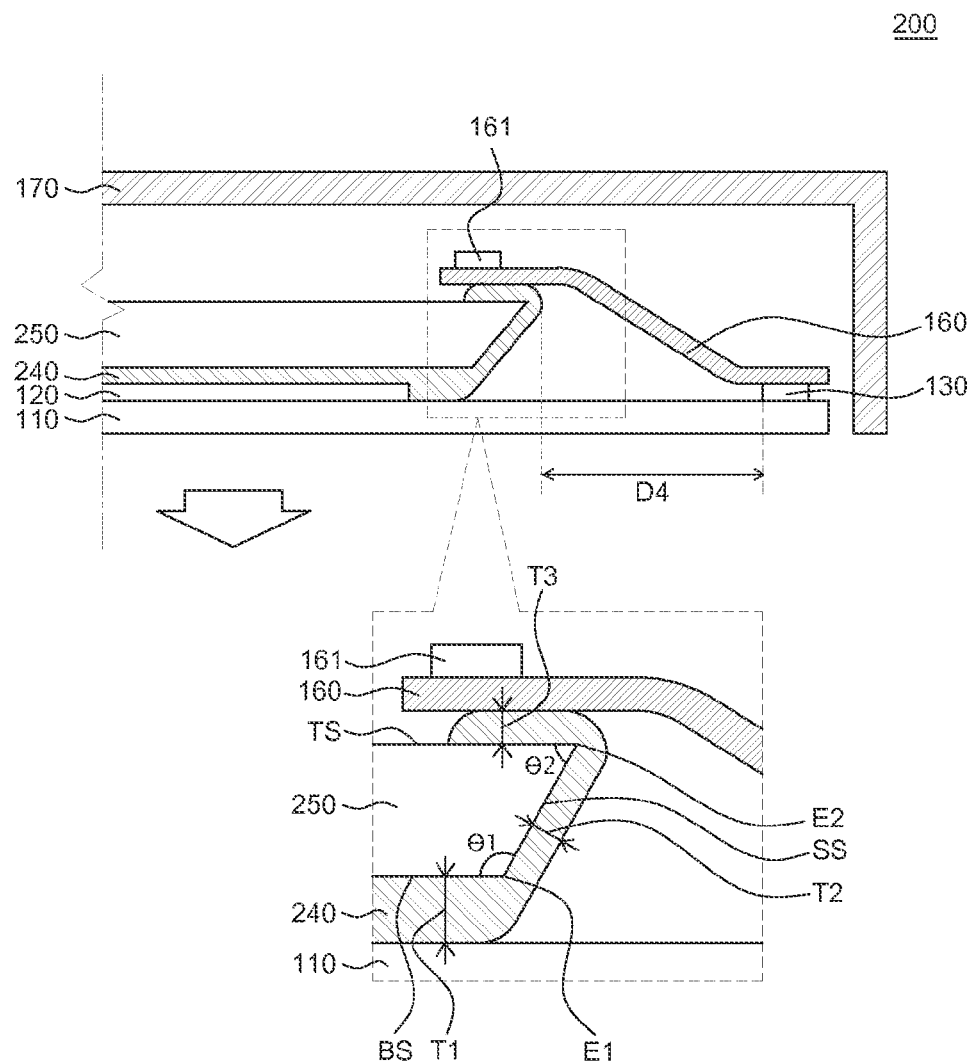
FIG. 3 is a cross-sectional view illustrating an organic light-emitting display device according to another example embodiment of the present invention.

FIG. 3 is a cross-sectional view illustrating an organic light-emitting display device 200 according to another example embodiment of the present invention. In describing the present example embodiment, components identical or corresponding to those of the above-described example embodiment may be assigned with the same reference numerals, and detailed description thereof may be omitted.

In the organic light-emitting display device 200 according to another example embodiment of the present invention, a side surface SS of a second substrate 250 may be inclined. Thus, a side surface of an encapsulation unit 240 covering the side surface of the second substrate 250 may also be inclined. To be specific, with reference to FIG. 3, the second substrate 250 may be inclined into a reverse-taper shape, and an area of a top surface TS of the second substrate 250 may be greater than an area of a bottom surface BS. Therefore, an angle θ1 of a first edge E1 of the second substrate 250 may be greater than 90° and lower than 180°, and an angle θ2 of a second edge E2 may be greater than 0° and lower than 90°.

As illustrated in FIG. 3, if the side surface SS of the second substrate 250 and the side surface of the encapsulation unit 240 are inclined as a reverse-taper shape, it may be possible to reduce damage to the driving film 160. For example, this may reduce the number of various contact defects caused by the second substrate 250 during the process of the organic light-emitting display device 200. Details thereof will be described below.

During the manufacturing process of the organic light-emitting display device 200, a constant or repetitive force may be continually applied to the side surface SS of the second substrate 250 in order to align the second substrate 250 with the other components. For example, when the encapsulation unit 240 is attached to the second substrate 250, a process of aligning the second substrate 250 and an equipment, or the second substrate 250 and the encapsulation unit 240, may be performed for achieving an accurate process. The aligning process may be performed by applying a constant hit to the side surface SS of the second substrate 250 and adjusting a position of the second substrate 250. By this process, the side surface SS of the second substrate 250 may not maintain its original shape due to the constant hit, and thus the side surface SS of the second substrate 250 may be bent or twisted toward a direction of the first substrate 110. Due to the deformation of the second substrate 250, the second substrate 250 may be brought into contact with a line or the like formed on the first substrate 110, which may result in a burnt defect caused by an electrical short. That is, the second substrate 250 formed of a metallic material may be brought into contact with a micro-pattern line on the first substrate 110, so that a short occurs between signals flowing through the line, resulting in a burnt defect in which surroundings are burnt.

According to another example embodiment of the present invention, if the side surface SS of the second substrate 250 is inclined as a reverse-taper shape, it may be possible to reduce the bending of the side surface SS of the second substrate 250 toward the direction of the first substrate 220 as compared with a case where the side surface SS of the second substrate 250 is flat or inclined as a taper shape. That is, because the side surface SS of the second substrate 250 is inclined as a reverse-taper shape, when a shock is applied to the second substrate 250, an area of the side surface SS that receives the shock is reduced and thus the shock is dispersed. Even if the side surface SS is deformed, the side surface SS is deformed as being bent not toward the first substrate 110, but toward a direction opposite to the first substrate 110. Thus, it is possible to reduce contact defects with respect to the line, or the like, formed on the first substrate 110.

However, in this example, the second edge E2 of the second substrate 250 may be sharper. Therefore, defects caused by damage to the driving film 160 due to the second substrate 250 may increase. Thus, because the inclined side surface SS of the second substrate 250 is covered by the encapsulation unit 240, damage to the driving film 160 caused by the second substrate 250 may be reduced.

Accordingly, in the organic light-emitting display device 200 according to another example embodiment of the present invention, because the side surface SS of the second substrate 250 and the side surface of the encapsulation unit 240 are inclined as a reverse-taper shape, it may be possible to reduce damage to the driving film 160 caused by the second substrate 250, and it may be more effective in improving various contact defects caused by deformation of the second substrate 250 during the manufacturing process of the organic light-emitting display device 200.

Meanwhile, when the driving film 160 is attached to the pad unit 130, it may not be necessary to increase a distance between the second substrate 250 and the pad unit 130 in order to reduce damage to the driving film 160 caused by an attachment pressure. This may be effective in realizing a narrow bezel. In an example when a narrow bezel of the organic light-emitting display device 200 is realized, a distance D4 from an outermost side surface of the encapsulation unit 240 disposed on the side surface SS of the second substrate 250 to the pad unit 130 may be about 750 μm or less, as illustrated in FIG. 3. Herein, the outermost side surface of the encapsulation unit 240 refers to the most protruded portion of the inclined side surface of the encapsulation unit 240.

Further, as illustrated in FIG. 3, the thickness T2 of the encapsulation unit 240 disposed on the side surface SS of the second substrate 250 or the thickness T3 of the encapsulation unit 240 disposed on a top surface TS of the second substrate 250 may be smaller than the thickness T1 of the encapsulation unit 240 disposed on a bottom surface BS of the second substrate 250. For example, the thickness T1 of the encapsulation unit 240 disposed on the bottom surface BS of the second substrate 250 may need to be sufficient to protect the organic light-emitting element 120 against infiltration of moisture or oxygen from the outside, and may be in a range of about 10 μm to 100 μm. However, because the thickness T2 or T3 of the encapsulation unit 240 disposed on the inclined side surface SS or the top surface TS of the second substrate 250 may only be required to be a thickness to directly contact the driving film 160 with the second substrate 250, the thickness T2 or T3 may be smaller than the thickness T1 of the encapsulation unit 240 disposed on the bottom surface BS of the second substrate 250.

Figure 4:
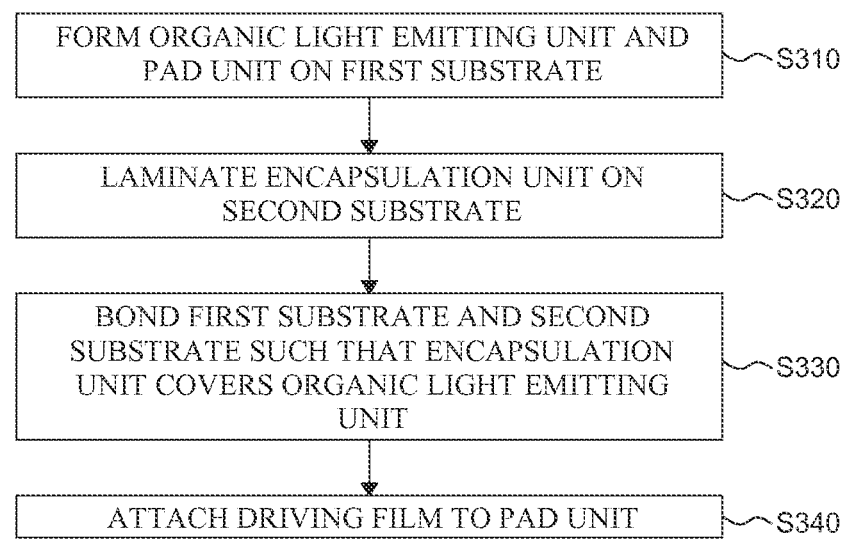
FIG. 4 is a flowchart illustrating a method for manufacturing an organic light-emitting display device according to an example embodiment of the present invention.

FIG. 4 is a flowchart illustrating a method for manufacturing an organic light-emitting display device according to an example embodiment of the present invention, and FIG. 5A to FIG. 5E are cross-sectional views illustrating a method for manufacturing an organic light-emitting display device according to an example embodiment of the present invention.

The method for manufacturing an organic light-emitting display according to an example embodiment of the present invention may include forming an organic light-emitting element and a pad unit on a first substrate (S310); laminating an encapsulation unit on a second substrate (S320); bonding the first substrate and the second substrate such that the encapsulation unit covers the organic light-emitting element (S330); and attaching a driving film mounting a driving chip thereon to the pad unit (S340), as illustrated in FIG. 4.

Figure 5A:
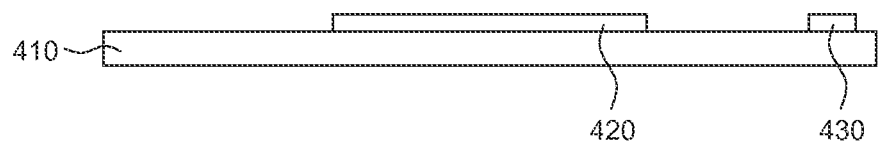
FIGS. 5A to 5E are cross-sectional views illustrating a method for manufacturing an organic light-emitting display device according to an example embodiment of the present invention.

With reference to FIG. 5A, an organic light-emitting element 420 and a pad unit 430 are formed on a first substrate 410 (S310). The organic light-emitting element 420 is formed at a central portion of the first substrate 410 and the pad unit 430 is formed at a peripheral portion of the first substrate 410. Further, the organic light-emitting element 420 may include an anode, an organic light-emitting layer, and a cathode, and may be formed by a typical manufacturing method.

Figure 5B:
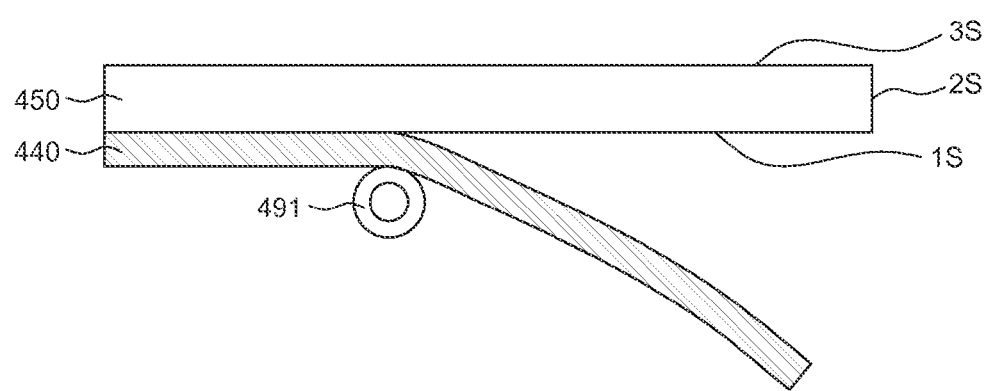

Further, with reference to FIG. 5B, an encapsulation unit 440 is laminated on a second substrate 450 (S320). The second substrate 450 includes a first surface 1S, a second surface 2S extended from the first surface 1S, and a third surface 3S extended from the second surface 2S and facing the first surface 1S. In other words, the second substrate includes a first surface 1S, a second surface 2S, and a third surface 3S facing the first surface, the second surface 2S being a side surface spanning between the first surface 1S and the third surface 3S. For example, the encapsulation unit 440 may be attached to the first surface 1S of the second substrate 450 by applying heat or pressure to the encapsulation unit 440 with a roller 491, such as silicon rubber.

The step (S310) of forming the organic light-emitting element 420 and the pad unit 430 on the first substrate 410 and the step (S320) of laminating the encapsulation unit 440 on the second substrate 450 may be performed in sequence or may be performed at the same time.

Figure 5C:
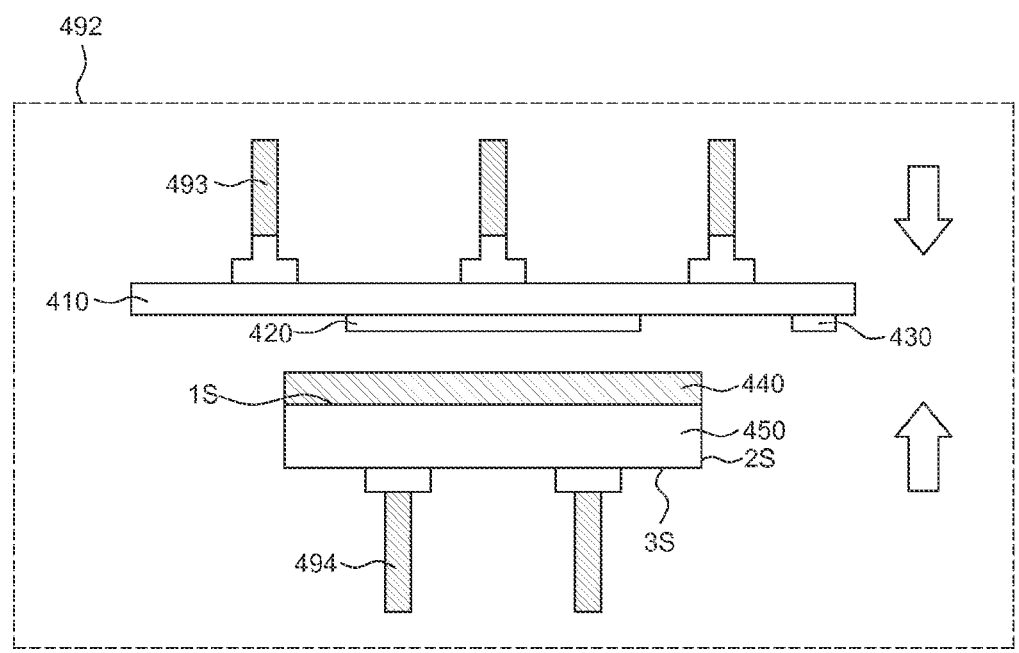
Figure 5D:
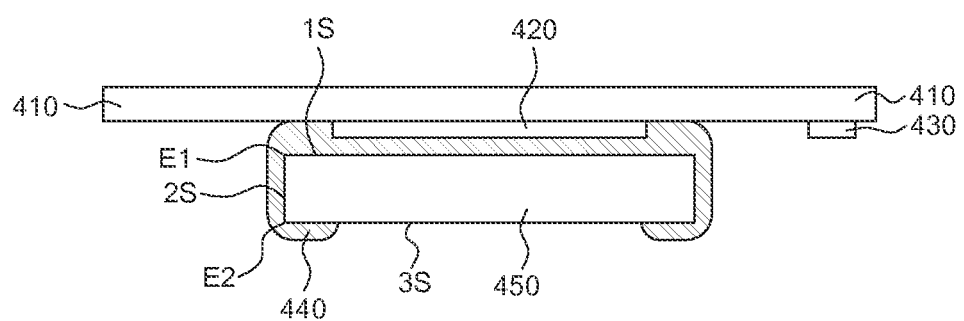

Then, as illustrated in FIG. 5C and FIG. 5D, the first substrate 410 and the second substrate 450 are bonded to each other such that the encapsulation unit 440 covers the organic light-emitting element 420 (S330).

For example, with reference to FIG. 5C, a lower supporting member 494 is fixed to the third surface 3S of the second substrate 450, e.g., the surface opposite to the first surface 1S to which the encapsulation unit 440 is attached, and an upper supporting member 493 is fixed to a surface of the first substrate 410 opposite to a surface on which the organic light-emitting element 420 and the pad unit 430 are formed. Then, the second substrate 450 and the first substrate 410 are bonded to face each other, such that the encapsulation unit 440 covers the organic light-emitting element 420. The second substrate 450 and the first substrate 410 may be bonded to each other within a chamber 492. The inside of the chamber 492 may be in a vacuum state in order to minimize infiltration of oxygen or moisture into the organic light-emitting element 420 from the outside.

Further, the second substrate 450 (on which the encapsulation unit 440 is formed) is disposed under the first substrate 410 (on which the organic light-emitting element 420 is formed). Then, the second substrate 450 and the first substrate 410 undergo a bonding process. Also, the lower supporting member 494 may be moved toward the first substrate 410 to be bonded while the upper supporting member 493 is fixed. Or, the upper supporting member 493 may be moved toward the second substrate 450 to be bonded while the lower supporting member 494 is fixed. Otherwise, the upper supporting member 493 and the lower supporting member 494 may be moved to each other to be bonded.

When the first substrate 410 and the second substrate 450 are bonded to each other, heat or pressure may be applied to the encapsulation unit 440. Due to the heat or pressure, the encapsulation unit 440 formed of a thermosetting resin may be decreased in solidity and may turn into a state with an increased viscosity, e.g., a jelly-like semisolid state. With reference to FIG. 5D, as described above, the second substrate 450 (on which the encapsulation unit 440 is laminated) is disposed under the first substrate 410 (on which the organic light-emitting element 420 is formed). Then, the second substrate 450 and the first substrate 410 undergo a bonding process. Thus, the encapsulation unit 440 in a semisolid state flows along the surface of the second substrate 450, e.g., by gravity. That is, the encapsulation unit 440 having a viscosity is extended from the first surface 1S of the second surface 450 to cover a part of the second surface 2S and the third surface 3S by surface tension. In other words, the encapsulation unit 440 may be extended to cover from an edge where the first surface 1S and the second surface 2S of the second substrate 450 meet to an edge where the second surface 2S and the third surface 3S meet. If the encapsulation unit 440 is extended to cover the side surface of the second substrate 450, the solidity of the encapsulation unit 440 may be increased and the viscosity thereof can be reduced by curing. Process conditions, such as a bonding time, an applied temperature, an applied pressure, a curing time, etc., for forming the encapsulation unit 440 to cover the side surface of the second substrate 450 may be determined depending on a property of the material of the encapsulation unit 440. For example, when the first substrate 410 and the second substrate 450 are bonded to each other, heat of about 150° C. may be applied, and when the encapsulation unit 440 is cured, heat of about 100° C. may be applied for approximately 3 hours, but may not be limited thereto.

Further, as illustrated in FIG. 5C, the length of the second substrate 450 at a cross section is the same as the length of the encapsulation unit 440 at the cross section. However, the length of the encapsulation unit 440 may be smaller than the length of the second substrate 450, depending on a property of the material of the encapsulation unit 440 and process conditions. For example, if the material of the encapsulation unit 440 has a high viscosity, the bonding process may be performed in a state where the cross section of the encapsulation unit 440 is formed to have a smaller length than the cross section of the second substrate 450. Thus, even under the same process conditions, it may be possible to control the encapsulation unit 440 not to be extended more than needed or designed.

Figure 5E:
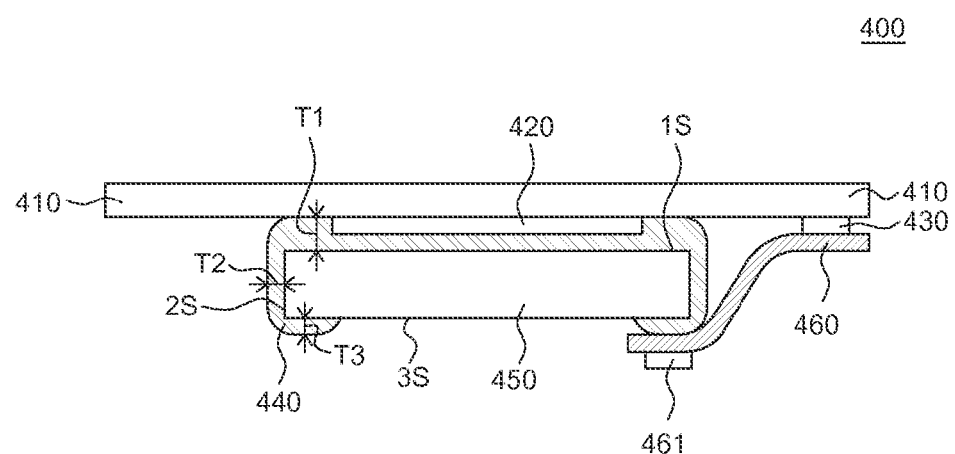

Finally, with reference to FIG. 5E, the driving film 460 mounting the driving chip 461 may be attached to the pad unit 430 of the first substrate 410 (S340). As illustrated in FIG. 5E, the thickness T2 or T3 of the encapsulation unit 440 disposed on the second surface 2S or the third surface 3S of the second substrate 450 may be formed to be smaller than the thickness T1 of the encapsulation unit 440 disposed on the first surface 1S of the second substrate 450. The thickness T1 of the encapsulation unit 440 disposed on the first surface 1S of the second substrate 450 may need to be sufficient to protect the organic light-emitting element 420 against infiltration of moisture, oxygen, or a shock from the outside. However, because the thickness T2 or T3 of the encapsulation unit 440 disposed on the second surface 2S or the third surface 3S of the second substrate 450 may be required to have a thickness by which the edge of the second substrate 450 does not damage the driving film 460, the thickness T2 or T3 may be smaller than the thickness T1 of the encapsulation unit 440 disposed on the first surface 1S of the second substrate 450.

FIG. 5E illustrates that the encapsulation unit 440 may be formed to cover both side surfaces of the second substrate 450. However, depending on a design, the encapsulation unit 440 may be formed to cover only a side surface of the second substrate 450 at a portion where the driving film 460 is attached, by adjusting a length of the cross section of the second substrate 450 and a length of the cross section of the encapsulation unit 440. For example, at the portion where the driving film 460 is attached, the side surface of the second substrate 450 and the side surface of the encapsulation unit 440 are on the same plane. At a portion where the driving film 460 is not attached, a length of the cross section of the second substrate 450 and a length of the cross section of the encapsulation unit 440 may be adjusted such that the side surface of the second substrate 450 is further protruded than the opposite side surface of the encapsulation unit 440. In this case, under the same process conditions, there is a difference in an extended amount of the encapsulation unit 440 along the surface of the second substrate 450. Therefore, depending on a design, the encapsulation unit 440 may be formed to cover only one side surface of the second substrate 450.

Accordingly, in the method for manufacturing the organic light-emitting display device 400 according to an example embodiment of the present invention, the encapsulation unit 440 is disposed to cover the side surface of the second substrate 450, and, thus, it may be effective in reducing various driving defects caused by damage to the driving film 460 due to the second substrate 450 without requiring any additional layer or a specific process.

Although the example embodiments of the present invention have been described in detail with reference to the accompanying drawings, the present invention is not limited thereto and may be embodied in many different forms without departing from the technical concept of the present invention. Therefore, the example embodiments of the present invention are provided for illustrative purposes only but not intended to limit the technical concept of the present invention. The scope of the technical concept of the present invention is not limited thereto. Therefore, it should be understood that the above-described example embodiments are illustrative in all aspects and do not limit the present invention. The protective scope of the present invention should be construed based on the following claims, and all the technical concepts in the equivalent scope thereof should be construed as falling within the scope of the present invention.

It will be apparent to those skilled in the art that various modifications and variations can be made in the display device of the present invention without departing from the spirit or scope of the invention. Thus, it is intended that the present invention cover the modifications and variations of this invention provided they come within the scope of the appended claims and their equivalents.

What is claimed is:
1. An organic light-emitting display device, comprising:
an organic light-emitting element on a first substrate;
an encapsulation unit covering the organic light-emitting element;
a metal substrate on the encapsulation unit;
a structure in which a driving film, having a driving chip mounted thereon, is connected to a pad unit on the first substrate and to not be protruded further than the first substrate;
wherein the encapsulation unit extends from a bottom surface of the metal substrate to a portion of a top surface of the metal substrate, so that a portion of the encapsulation unit is disposed between the metal substrate and the driving film which is in contact with the portion of the encapsulation unit, thereby reducing damage to the driving film caused by the metal substrate, wherein the metal substrate is inclined in a reverse-taper shape in which an area of the top surface of the metal substrate is greater than an area of the bottom surface of the metal substrate and the encapsulation unit is formed along the metal substrate.

2. The organic light-emitting display device according to claim 1, wherein the metal substrate and the driving film are not in direct contact with each other due to the encapsulation unit between the metal substrate and the driving film.

3. The organic light-emitting display device according to claim 2, wherein the encapsulation unit covers at least two different edges sharing a side surface of the metal substrate.

4. The organic light-emitting display device according to claim 3, wherein the encapsulation unit has different thicknesses at different positions.

5. The organic light-emitting display device according to claim 1, wherein the driving film is connected in a reverse-bonding manner to not protrude further than the first substrate.

6. An organic light-emitting display device, comprising:
an organic light-emitting element on a first substrate;
an encapsulation unit covering the organic light-emitting element;
a second substrate formed of a metal material on the encapsulation unit;
a pad unit on the first substrate; and
a driving film connected to the pad unit and having a driving chip mounted thereon,
wherein the encapsulation unit covers the second substrate at least from a first edge, where a bottom surface and a side surface of the second substrate meet, to a second edge, where a top surface and the side surface of the second substrate meet,
wherein the driving film is not in contact with the second edge of the second substrate, and
wherein the second substrate is inclined in a reverse-taper shape in which an area of the top surface of the second substrate is greater than an area of the bottom surface of the second substrate and the encapsulation unit is formed along the second substrate.

7. The organic light-emitting display device according to claim 6, wherein the thickness of the encapsulation unit on the side surface or the top surface of the second substrate is smaller than the thickness of the encapsulation unit on the bottom surface of the second substrate.

8. The organic light-emitting display device according to claim 6, wherein a distance from an outermost side surface of the encapsulation unit to the pad unit is 750 μm or less.

9. The organic light-emitting display device according to claim 6, wherein the first edge has an angle greater than 90° and less than 180°, and the second edge has an angle greater than 0° and less than 90°.

10. The organic light-emitting display device according to claim 9, wherein the side surface of the encapsulation unit is inclined.

11. The organic light-emitting display device according to claim 6, wherein the second substrate is formed of a metal material.

12. The organic light-emitting display device according to claim 11, wherein the organic light-emitting element is configured to emit light toward the first substrate.

13. An organic light-emitting display device, comprising:
a first substrate;
an organic light-emitting element;
a second substrate formed of a metal material;
the organic light-emitting element between the first substrate and the second substrate,
wherein the second substrate includes a bottom surface having a first edge, a top surface having a second edge, and a side surface defined between the first edge and the second edge;
an encapsulation unit covering the organic light-emitting element and on the bottom surface, the side surface, and a portion of the top surface of the second substrate; and
a driving film on the first substrate and on the encapsulation unit where the encapsulation unit covers the portion of the top surface of the second substrate,
the encapsulation unit between the driving film and the second substrate,
wherein one side of the driving film contacts the first substrate via a pad unit, and a driving chip is on the other side of the driving film, and
wherein the second substrate is inclined in a reverse-taper shape in which an area of the top surface of the second substrate is greater than an area of the bottom surface of the second substrate and the encapsulation unit is formed along the second substrate.

14. The organic light-emitting display device of claim 13, wherein a thickness of the encapsulation unit on the bottom surface of the second substrate is greater than a thickness of the encapsulation unit on the side surface of the second substrate, and is greater than a thickness of the encapsulation unit on the top surface of the second substrate.

15. The organic light-emitting display device of claim 14, wherein the thickness of the encapsulation unit on the bottom surface of the second substrate is in a range of about 10 μm to 100 μm.

16. The organic light-emitting display device of claim 13, wherein the encapsulation unit is configured to bond the first substrate and the second substrate together.

17. The organic light-emitting display device of claim 13, wherein the side surface of the second substrate forms an obtuse angle with the bottom surface of the second substrate in a cross-section view, and forms an acute angle with the top surface of the second substrate in the cross-section view.

18. An organic light-emitting display device, comprising:
an organic light-emitting element on a first substrate;
a metal layer formed of a metal material on the organic light-emitting element;
an encapsulation layer covering the organic light-emitting element between the metal layer and the organic light-emitting element;
a pad unit on the first substrate; and
a driving film connected to the pad unit having a driving chip mounted thereon,
wherein the encapsulation layer extends from a bottom surface of the metal layer to a portion of a top surface of the metal layer, so that a portion of the encapsulation layer is disposed between the metal layer and the driving film which is in contact with the portion of the encapsulation layer, thereby reducing damage to the driving film caused by the edge of the metal layer, and
wherein the metal layer is inclined in a reverse-taper shape in which an area of the top surface of the metal layer is greater than an area of the bottom surface of the metal layer and the encapsulation layer is formed along the metal layer.

19. The organic light-emitting display device according to claim 18, wherein the driving film is connected in a reverse-bonding manner to the first substrate.

20. The organic light-emitting display device according to claim 18, wherein the encapsulation layer is formed of a base material having a particular viscosity that allows a portion of the base material to flow over the edge of the metal layer due to gravity during a manufacturing process.

21. The organic light-emitting display device according to claim 20, wherein the base material is a curable resin.

* * * * *